United States Patent [19]
Kornachuk et al.

[11] Patent Number: 5,999,482
[45] Date of Patent: Dec. 7, 1999

[54] HIGH SPEED MEMORY SELF-TIMING CIRCUITRY AND METHODS FOR IMPLEMENTING THE SAME

[75] Inventors: Steve P. Kornachuk; Scott T. Becker, both of San Jose, Calif.

[73] Assignee: Artisan Components, Inc., Sunnyvale, Calif.

[21] Appl. No.: 08/956,981

[22] Filed: Oct. 24, 1997

[51] Int. Cl.⁶ .................................................. G11C 8/00
[52] U.S. Cl. ...................... 365/233; 365/210; 365/194; 365/51
[58] Field of Search .................. 365/210, 233, 365/194, 51

[56] References Cited

U.S. PATENT DOCUMENTS

| | | | |
|---|---|---|---|
| 4,128,900 | 12/1978 | Lappington | 365/94 |
| 5,029,135 | 7/1991 | Okubo | 365/203 |
| 5,091,889 | 2/1992 | Hamano et al. | 365/233.5 |
| 5,146,427 | 9/1992 | Sasaki et al. | 365/189.05 |
| 5,214,609 | 5/1993 | Kato et al. | 365/230.01 |
| 5,270,590 | 12/1993 | Pascucci | 365/185.21 |
| 5,311,471 | 5/1994 | Matsumoto et al. | 365/189.05 |
| 5,404,334 | 4/1995 | Pascucci et al. | 365/210 |
| 5,414,663 | 5/1995 | Komarek et al. | 365/210 |
| 5,459,689 | 10/1995 | Hikichi | 365/189.09 |
| 5,555,521 | 9/1996 | Hamada et al. | 365/185.03 |
| 5,561,629 | 10/1996 | Curd | 365/185.21 |
| 5,596,539 | 1/1997 | Passow et al. | 365/210 |
| 5,608,681 | 3/1997 | Priebe et al. | 365/207 |
| 5,625,586 | 4/1997 | Yamasaki et al. | 365/104 |
| 5,636,161 | 6/1997 | Mann | 365/185.21 |
| 5,654,919 | 8/1997 | Kwon | 365/185.21 |
| 5,677,864 | 10/1997 | Chung | 365/63 |
| 5,694,369 | 12/1997 | Abe | 365/210 |
| 5,699,295 | 12/1997 | Yero | 365/185.21 |
| 5,751,649 | 5/1998 | Kornachuk et al. | 365/205 |
| 5,781,496 | 7/1998 | Pinkham et al. | 365/230.03 |
| 5,818,785 | 10/1998 | Ohshima | 365/230.03 |
| 5,831,924 | 11/1998 | Nitta et al. | 365/230.03 |
| 5,844,851 | 12/1998 | Pascucci et al. | 365/210 |

*Primary Examiner*—Andrew Q. Tran
*Attorney, Agent, or Firm*—Martine Penilla & Kim, LLP

[57] ABSTRACT

A memory circuit that includes a memory core having an array of core cells is provided. The array of core cells are coupled to a plurality of wordlines and a plurality of bitline pairs. The memory circuit further includes a self-timing path that has a model core cell that is coupled to a model wordline, and the model wordline is driven by a model wordline driver. The self-timing path also includes a model sense amplifier that is coupled to the model core cell through a pair of model bitlines. The model wordline and the pair of model bitlines are each coupled to a plurality of dummy core cells to approximate an RC delay of a worst case core cell of the array of core cells. Further, the model wordline is a folded wordline, such that the model wordline has a termination at a location that is proximate to the model wordline driver.

25 Claims, 10 Drawing Sheets

HIGH SPEED MEMORY SELF-TIMING CIRCUITRY AND METHODS FOR IMPLEMENTING THE SAME

BACKGROUND OF THE INVENTION

1. Field of the Invention

The present invention relates generally to integrated circuits, and more particularly to methods and apparatus for improved memory self-timing circuitry.

2. Description of the Related Art

Semiconductor memory cores are usually laid-out in array format, such that each individual core cell is coupled by a wordline and a pair of differential bitlines. To access data stored in a selected core cell, associated memory accessing circuitry is commonly designed around a memory core. For example, some of the key memory accessing circuitry typically includes addressing circuitry for selecting a core cell, wordline drivers for driving a selected wordline, and sense amplifiers for amplifying the signal read from the selected core cell.

For ease of understanding, FIG. 1 shows a block diagram of a memory circuit having a memory core 100 and associated access circuitry. As in conventional memory core designs, a plurality of core cells 102 are laid out in throughout the memory core 100. In this example, a control block circuit 110 is used to control access to selected memory core cells 102 through the use of wordline drivers 106 and sense amplifiers (SA) 104.

In this example, the control block circuit 110 is configured to produce a signal that triggers a selected wordline driver 106 upon a rising edge of the signal 116a. When the signal 116 experiences a falling edge (ie., at a time determined by a conventional self-timing architecture described below), the signal 116b will initiate the sensing of data through one of the selected sense amplifiers 104. As shown, the wordline drivers 106 are connected to each of the core cells 102 through the use of wordlines that interconnect each of the core cells 102 in a horizontal direction. In a like manner, the sense amplifiers 104 are connected to each of the core cells 102 in the vertical direction, through the use of differential bitlines.

In conventional memory circuitry, designers have used a self-timing architecture that enables a memory circuit to determine when the sense amplifiers 104 should commence sensing data from the core cells 102 in the memory core 100. Self-timing architectures are generally used to approximate a standard delay time (i.e., which is generally the worst case timing delay for a given core) which will be used when an access to any one of the core cells 102 is attempted. The self-timing architecture is generally needed because the actual delay time of a particular core cell 102 will generally be different depending on the location of the particular core cell 102. By way of example, a core cell 103 is located at the furthest location from a given wordline driver 106 and a given sense amplifier 104.

Therefore, an RC delay associated with the wordline that couples the wordline driver 106 to the core cell 103, and the RC delay associated with the bitlines that couple a sense amplifier 104 to the core cell 103, will have a combined RC delay that is larger than any other core cell 102 in the memory core 100. For example, the combined RC delay of the wordline and the bitlines that couple to a core cell 101, will be smaller than any other core cell that is laid out in the memory core 100. Therefore, the self-timing architecture which includes a model wordline driver 106', core cells 102', a model core cell 103', a model wordline 112a, model bitlines 112b, sense amplifier 104', and a self-timing return path 114 serves to establish the aforementioned standard delay time.

Accordingly, the self-timing architecture is well suited to estimate when enough bitline differential has been achieved (i.e., due to the worst case model core cell 103') to correctly perform a sense amplification to read the data of a given core cell 102 in the memory core 100. In operation, the control block circuitry will initiate a select signal 116a to the model wordline driver 106' to access the model core cell 103'. When the model core cell 103' has been accessed, a signal is passed through the model bitlines 112b, through sense amplifier 104' and along the self-timing return path 114, that communicates to the control block circuit 110.

A particular problem with conventional self-timing architectures is that memory circuit will be ready to read data once the sense amplifier 104' has received the signal from the model core cell 103'. However, the additional self-timing return path 114 will necessarily add an additional RC delay to the RC delay of the model wordline 112a and the model bitline 112b. This additional RC delay introduced by the self-timing return path 114 will unfortunately slow down a memory accessing operation. As such, the control block circuit 110 will not initiate a ready-to-read signal 116b to a given sense amplifier 104 until the control block circuit 110 receives the signal from the self-timing return path 114. Consequently, in applications where high-speed memory accessing is required, the performance of the entire memory circuit will suffer due to the additional RC delay introduced by the self-timing return path 114.

In view of the foregoing, there is a need for self-timed memory circuitry that avoids the introduction of unnecessary RC delays when access to a worst-case model core cell is performed.

SUMMARY OF THE INVENTION

Broadly speaking, the present invention fills these needs by providing methods and apparatuses for self-timing memory circuitry that eliminates unnecessary RC delays and substantially speeds up memory accessing operations. It should be appreciated that the present invention can be implemented in numerous ways, including as a process, an apparatus, a system, a device, or a method. Several embodiments of the present invention are described below.

In one embodiment, a memory circuit is disclosed. The memory circuit includes a memory core having an array of core cells. The array of core cells are coupled to a plurality of wordlines and a plurality of bitline pairs. The memory circuit further includes a self-timing path that has a model core cell that is coupled to a model wordline, and the model wordline is driven by a model wordline driver. The self-timing path also includes a model sense amplifier that is coupled to the model core cell through a pair of model bitlines. The model wordline and the pair of model bitlines are each coupled to a plurality of dummy core cells to approximate an RC delay of a worst case core cell of the array of core cells. Further, the model wordline is a folded wordline, such that the model wordline has a termination at a location that is proximate to the model wordline driver.

In another embodiment, a method for making a memory circuit with a self-timing path is disclosed. The method includes providing a memory core that has an array of core cells. The method further includes integrating a self-timing path of core cells along a model wordline and along a model pair of bitlines. The model wordline is folded such that a model core cell is placed substantially at a beginning point of the model wordline, and an ending point of the model wordline is coupled to the model core cell.

In yet another embodiment, a memory generator for producing a memory circuit that includes a self-timing path is disclosed. The memory circuit has a memory core with an array of core cells. In this embodiment, the memory generator is configured to generate a self-timing path of core cells along a model wordline and along a model pair of bitlines. The model wordline is folded such that a model core cell is placed substantially at a beginning point of the model wordline, and an ending point of the model wordline is coupled to the model core cell.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for self-timing memory circuitry that eliminates unnecessary RC delays and substantially speeds up memory accessing operations is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2A:
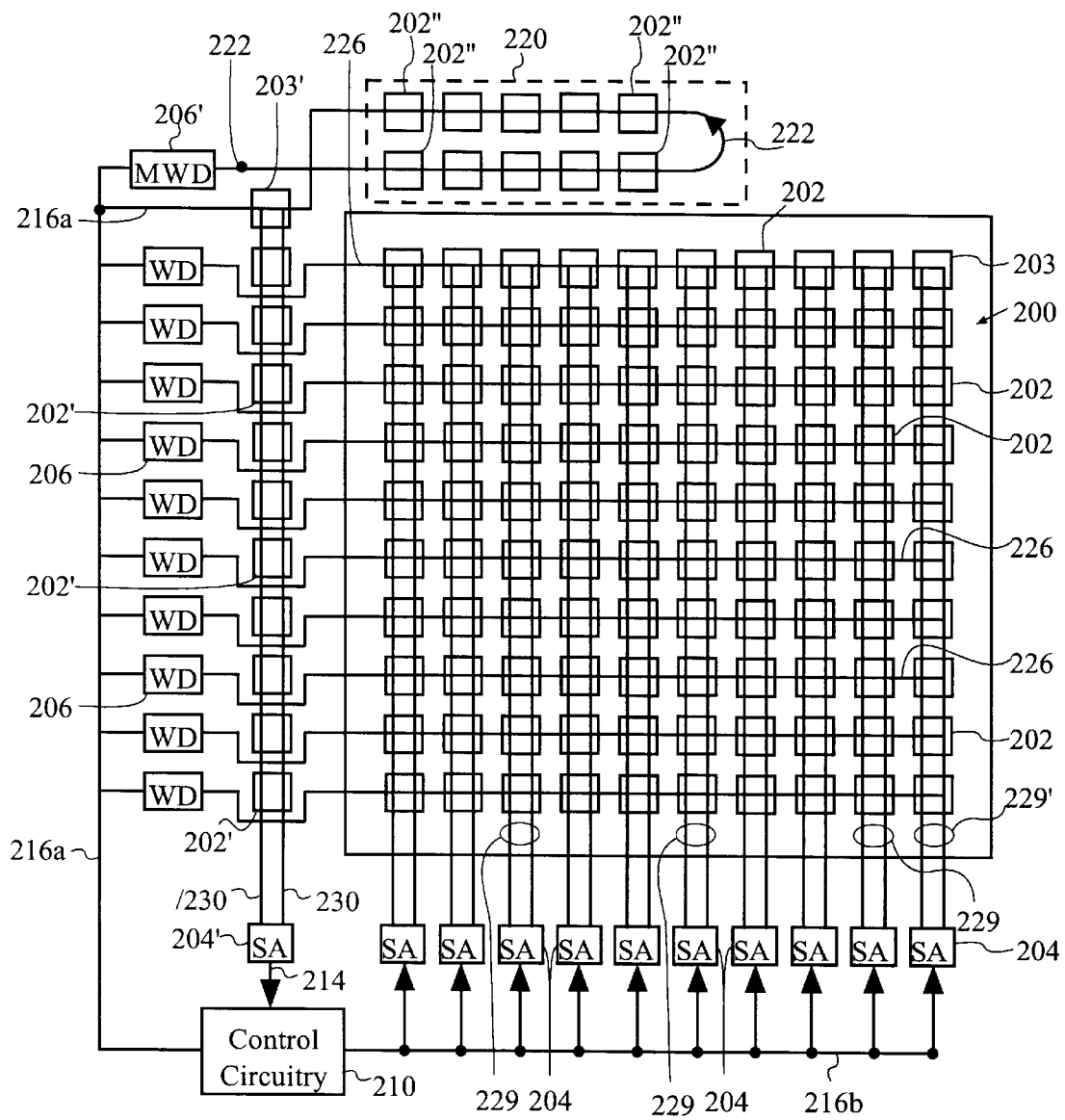
FIG. 2A shows a memory circuit having a memory core that includes an array of core cells in accordance with one embodiment of the present invention.

FIG. 2A shows a memory circuit having a memory core 200 with an array of core cells 202 in accordance with one embodiment of the present invention. As shown, the core cells 202 are coupled to wordline drivers 206 through wordlines 226 in the horizontal direction, and sense amplifiers 204 through bitlines 229 in the vertical direction. Control circuitry 210 is also shown coupled to each of the wordline drivers 206 and the sense amplifiers 204. In this example, the sense amplifiers 204 are shown as discrete blocks, however, it should be understood that the sense amplifier is typically a circuit that is coupled to each of the bitlines 229 through well known Y-decoder circuitry (not shown).

As is well known, Y-decoders are used for addressing a selected column (i.e., differential bitlines) within the memory core 200. For example, Y-decoders are generally implemented for reducing memory array aspect ratios by folding (i.e., dividing) long addressable memory columns into several shorter memory columns. Once folded into several columns, the Y-decoder is capable of accessing the addressed data by appropriately performing a suitable multiplexing function.

For more information on exemplary sense amplifying circuits, reference may be made to commonly assigned U.S. patent applications: (1) Ser. No. 08/806,335, entitled "HIGH SPEED MEMORY OUTPUT CIRCUITRY AND METHODS FOR IMPLEMENTING SAME" filed Feb. 26, 1997, now U.S. Pat. No. 5,751,649; and (2) Ser. No. 08/839,151, entitled "VOLTAGE SENSE AMPLIFIER AND METHODS FOR IMPLEMENTING THE SAME," filed Apr. 23, 1997, now U.S. Pat. No. 5,889,715. Further, for more information on exemplary wordline drivers 206, reference may be made to a commonly assigned U.S. patent application Ser. No. 08/837,611, entitled "HIGH SPEED ADDRESSING BUFFER AND METHODS FOR IMPLEMENTING SAME," filed Apr. 21, 1997, now U.S. Pat. No. 5,886,929. The three applications identified above are hereby incorporated by reference.

Figure 1:
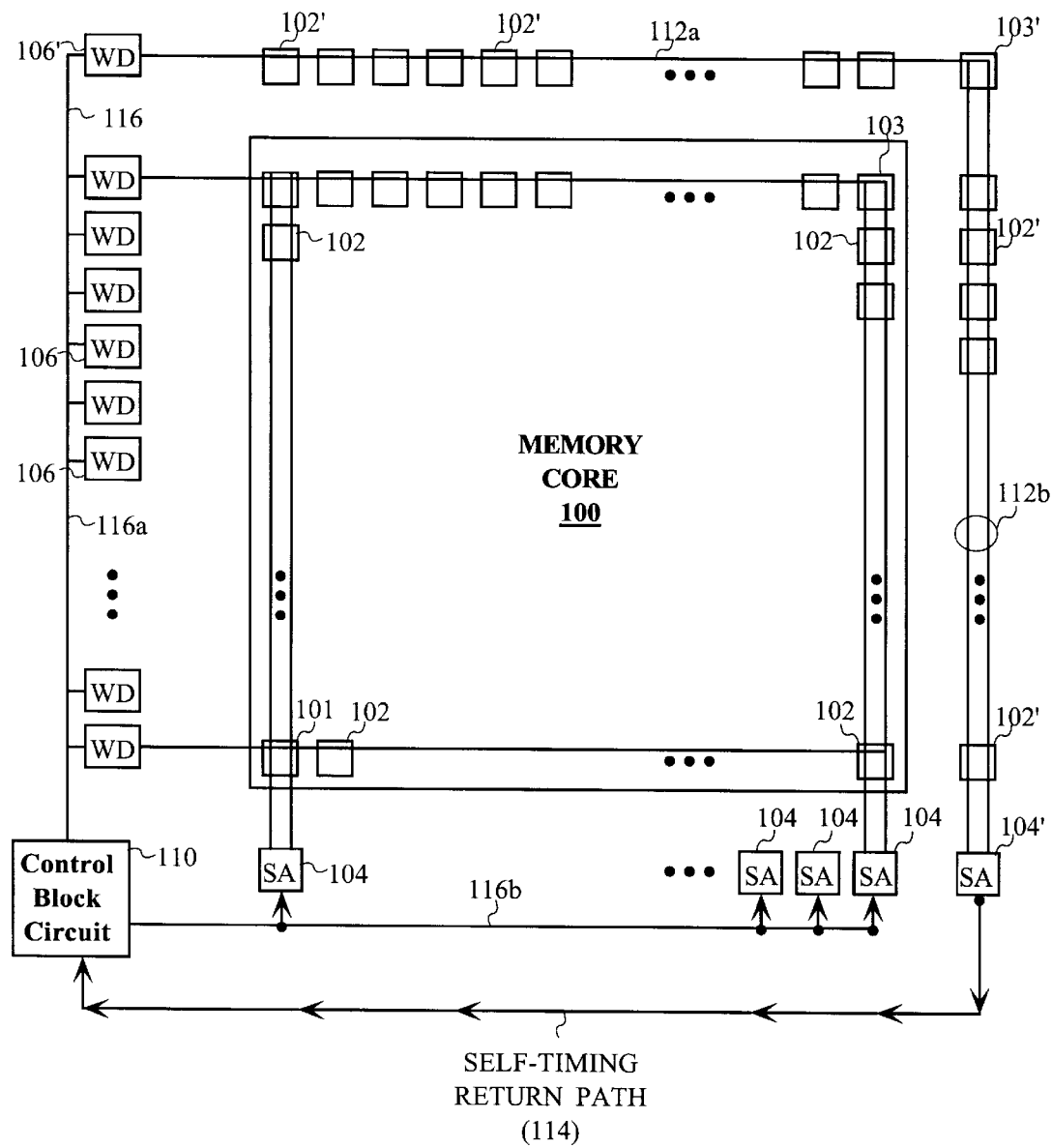
FIG. 1 shows a block diagram of a memory circuit having a memory core and associated access circuitry.

In this embodiment, an improved self-timing architecture is disclosed to eliminate delays associated with the self-timing return path 114 used in the conventional design of FIG. 1. For example, once the RC delays of a wordline 222 and differential bitlines (i.e., 230, /230) are rapidly transferred by a signal 214 to the control circuitry 210 (from a model sense amplifier 204'), a ready to read signal 216b will be immediately transmitted as shown in FIG. 2A. The elimination of the RC delay associated with the self-timing return path of conventional designs is primarily facilitated by a folded wordline 220.

Preferably, the folded wordline 220 will include half of a set of core cells 202" stacked over the remaining half. This arrangement therefore provides an efficient path to connect the end of the wordline 222 to the model core cell 203', which is now arranged at the top-leftmost side of the memory core 200. As shown, the model bitlines 230 and /230 are interconnecting a set core cells 202' that lead to the model core cell 203'. In operation, when the control circuitry 210 provides a wordline enable signal with a rising edge of the signal 216a to the model wordline driver 206', the RC delay is computed for only about the path traversed by the wordline 222 and the differential bitlines 230 and /230, that lead to the model sense amplifier 204'.

At that point, the model sense signal 214 is provided to the control circuitry 210. When the control circuitry 210 receives the signal 214, the control circuitry 210 will pass the falling edge of the ready to read signal 216b to the selected sense amplifiers 204. It is important to note that the self-timing architecture of the present invention provides a standard delay to be used by all of the core cells 202 and core cell 203 of the memory core 200. Further, the standard delay is preferably no worse than the RC delay for the worst case scenario of reading the core cell 203.

Figure 2B:
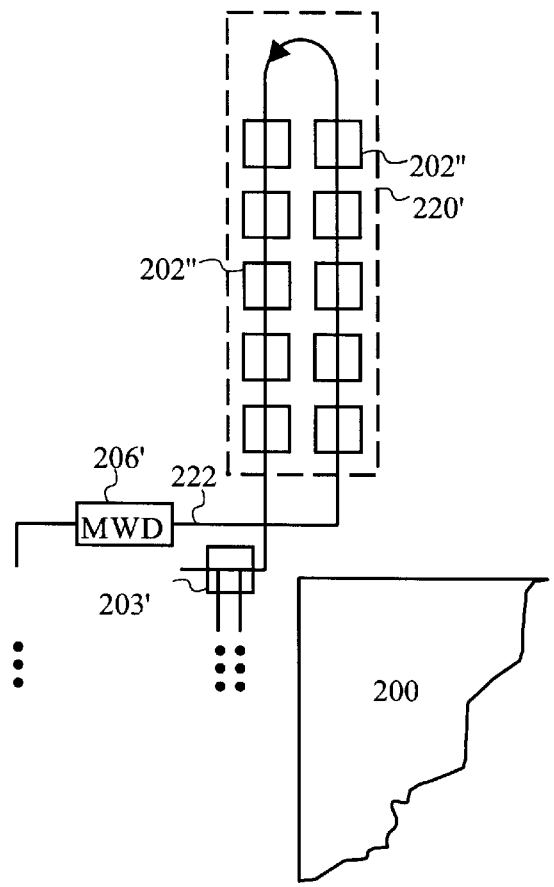
FIGS. 2B and 2C show arrangements for a folded wordline in accordance with alternative embodiments of the present invention.
Figure 2C:
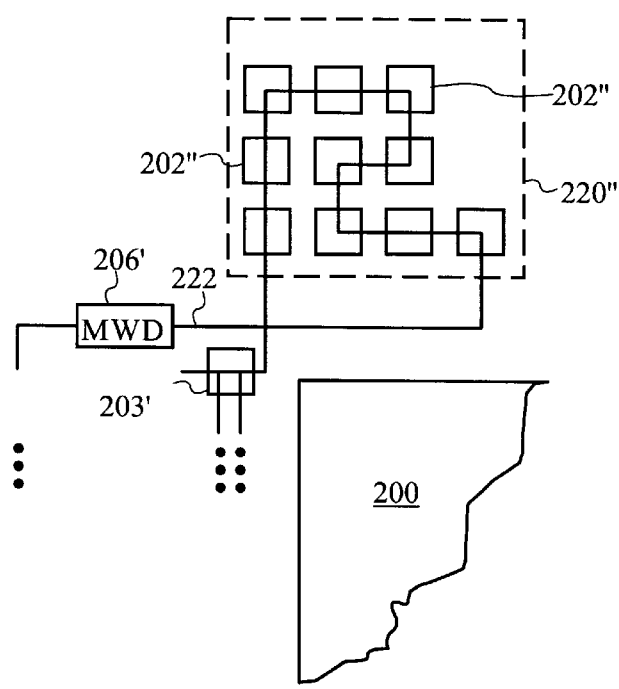

FIG. 2B shows another arrangement for the folded wordline 220' in accordance with an alternative embodiment of the present invention. As shown, the folded wordline 220' is arranged at a 90 degree angle compared to the folded wordline 220 of FIG. 2A. This embodiment illustrates that the folded wordline 220' may be arranged in any manner that makes layout more suitable for a particular design, and need not be arranged in one horizontal orientation. For example, FIG. 2C shows yet another orientation for a folded wordline 220". In this example, the folded wordline 220" is laid out in an arrangement that would possibly make laying-out other miscellaneous logic more feasible in a particular integrated circuit design.

It should therefore be understood that the manner in which the folded wordline is arranged is not important, so long as the folded wordline provides a termination path of the wordline 222 substantially near the output of the model wordline driver 206'. When this is properly arranged, no excess RC delay is introduced in the self-timing path. Therefore, only the representative RC delay of the model wordline 222 and the model bitlines 230 and /230 are used by the control circuitry 210 to determine that a ready-to-read signal 216b should be provided to the given sense amplifiers 204.

Figure 3:
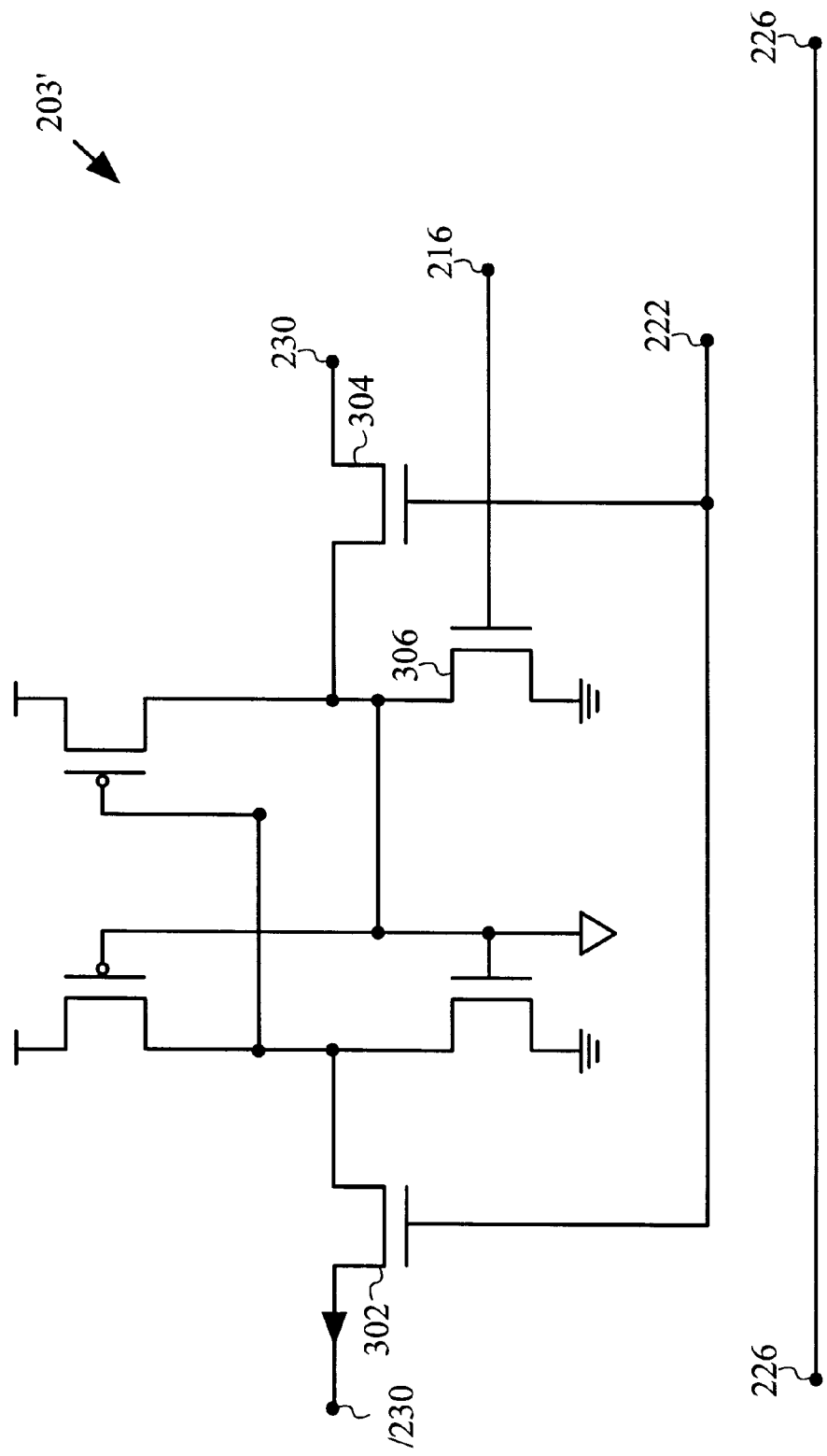
FIG. 3 shows an example of a model core cell in accordance with one embodiment of the present invention.

FIG. 3 shows an example of a model core cell 203' in accordance with one embodiment of the present invention. In this embodiment, a wordline 226 is shown as a line that does not interconnect with the model core cell 203', but leads directly into the core cells 202 that lie within the memory core 200. However, the model wordline 222 is shown coupled to a gate of transistors 302 and 304. Also shown is the model bitline 230 which is connected to a terminal of transistor 304, and the complementary model bitline /230 that is connected to a terminal of transistor 302. Further, signal 216 is provided by the control circuitry 210 to a gate of a transistor 306. In general, the model core cell 203' is configured to perform a pull-down operation, which is configured to approximate the pull down strength of a core cell 202 that lies within the memory core 200.

In another embodiment, the model core cell 203' may be finely tuned to increase its pull-down drive depending on the depth of a particular memory core 200. For example, the model core cell 203' may be replaced by more than one model core cells to produce increased pull down strength, which may be useful to eliminate any delays that may be introduced by the control circuitry 210 or delays associated with driving larger memory cores.

Figure 4:
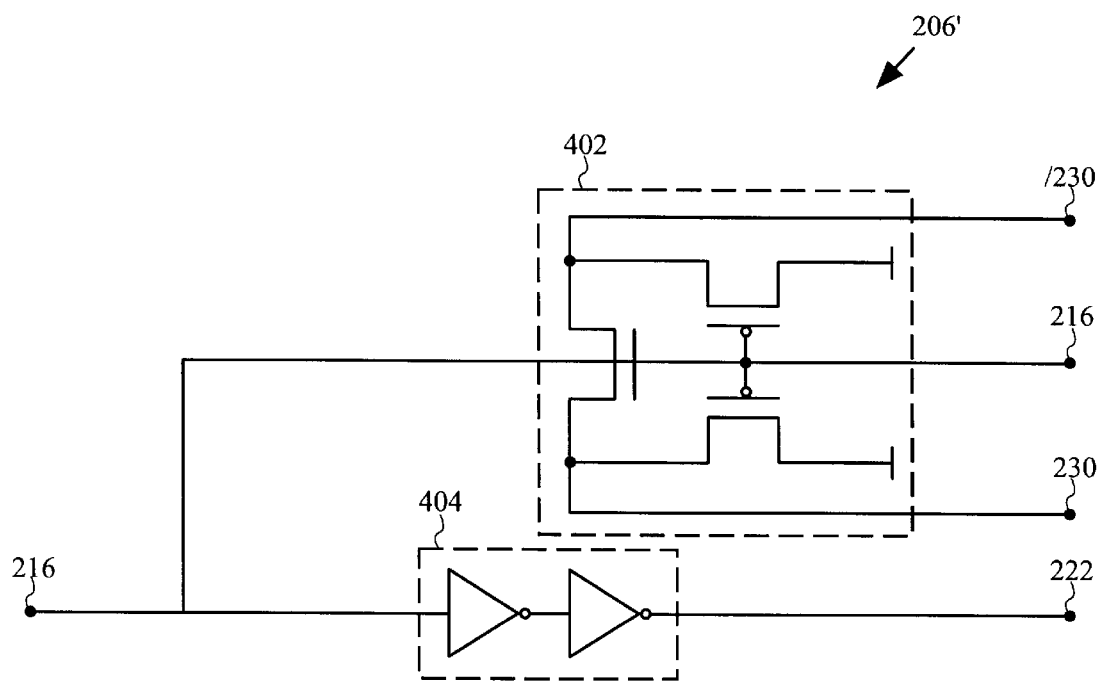
FIG. 4 is an example of a model wordline driver as shown in FIG. 2A above in accordance with one embodiment of the present invention.

FIG. 4 is an example of a model wordline driver 206' as shown in FIG. 2A above in accordance with one embodiment of the present invention. The model wordline driver 206' is shown including a pre-charge circuit 402 that is coupled to the model bitlines 230 and /230, and the signal 216. Also shown is a buffer 404 that receives the signal 216 and outputs a buffered signal onto the model wordline 222. In general, when signal 216 goes HI (i.e., experiences a rising edge), the model wordline driver 206' is triggered to commence an access operation. Further, the buffer 404 is provided with sufficient delay to approximate the delay that will be experienced through a wordline drivers 206 that accesses the memory core 200, as shown in FIG. 2A above.

Figure 5A:
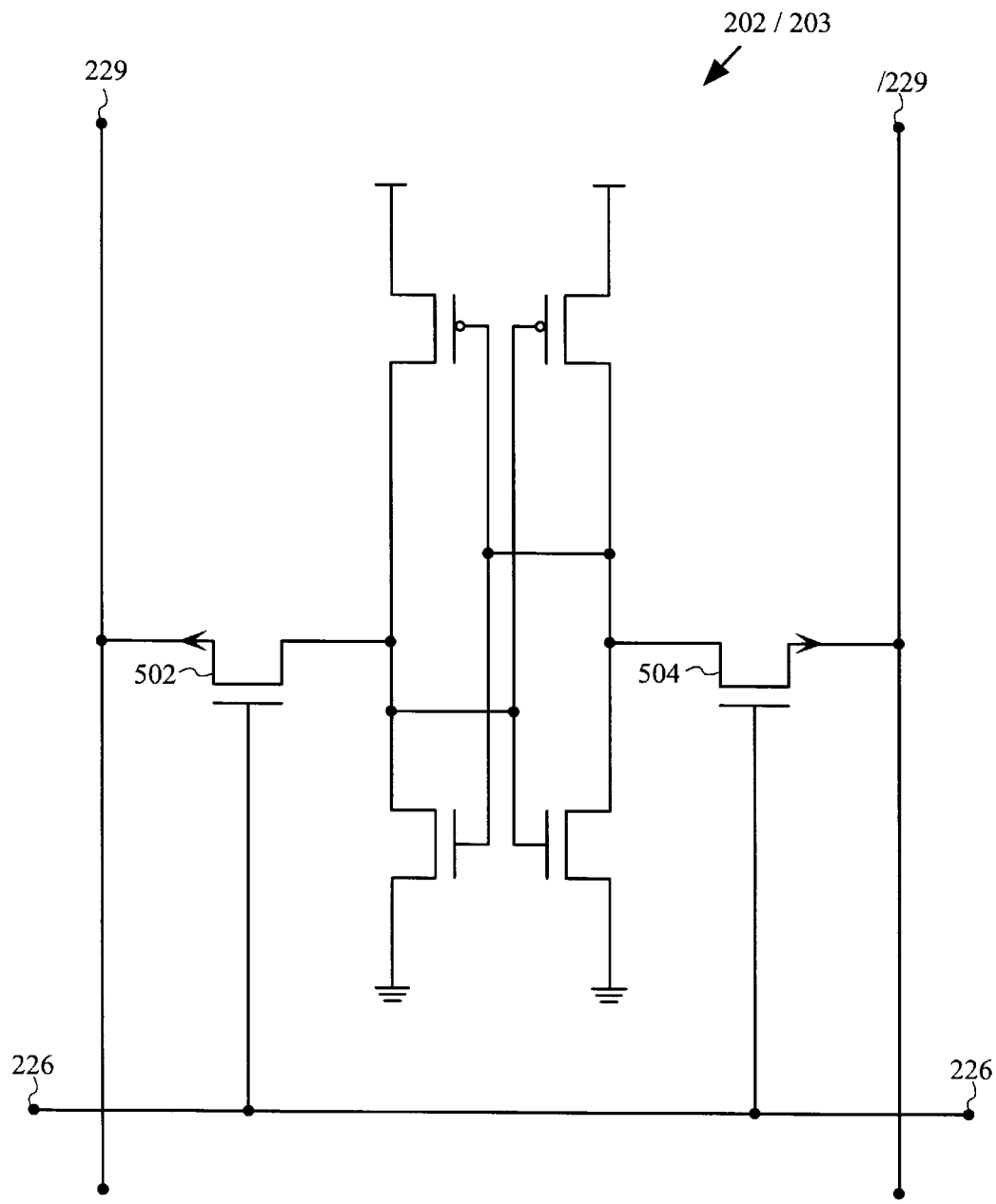
FIG. 5A shows an example of a core cell that lies in the memory core in accordance with one embodiment of the present invention.

FIG. 5A shows an example of a core cell 202 and 203 that lie in the memory core 200 in accordance with one embodiment of the present invention. As shown, the complimentary bitlines 229 and /229 are coupled to drain terminals of a pair of pass gate transistors 502 and 504, respectively. The wordline 226 is shown coupled to the gate of the pass gate transistors 502 and 504. Although one exemplary core cell 202/203 is shown, it should be understood that the embodiments of the present invention are applicable to other core cells and other memory circuits.

Thus, the embodiment of the present invention may be applied to any number of memory circuits, such as ROM memory circuits, RAM memory circuits, SRAM memory circuits, DRAM memory circuits, EPROM memory circuits, EEPROM memory circuits, etc. For more information on memory circuits and core cells, reference may be made to a book entitled "The Art of Electronics, $2^{nd}$ Edition," by Paul Horowitz and Winfield Hill, pages 812–820 (1996). This book is hereby incorporated by reference.

Figure 5B:
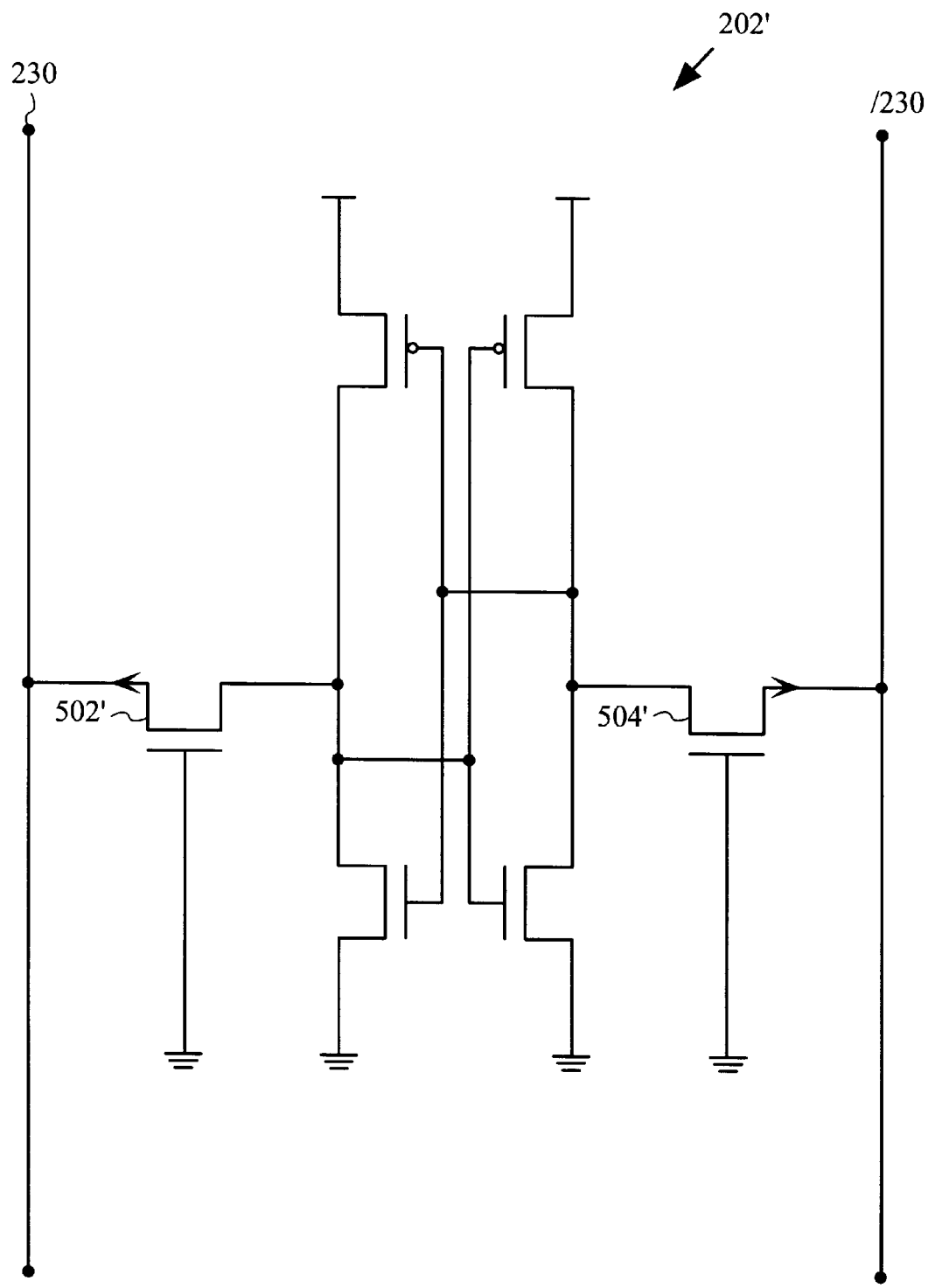
FIG. 5B shows an example of a core cell that is laid out along the model bitlines in accordance with one embodiment of the present invention.

FIG. 5B shows an example of a core cell 202' which is laid out along the model bitline in accordance with one embodiment of the present invention. As shown, bitline 230 is coupled to a drain terminal of a pass gate transistor 502', and bitline /230 is coupled to a drain terminal of a pass gate transistor 504'. In this embodiment, the gate of each of the pass gate transistors 502' and 504' are coupled to ground. Each of the core cells 202' are generally dummy core cells that are used to approximate the RC delay experienced on the bitlines 229' of the memory core 200.

Figure 5C:
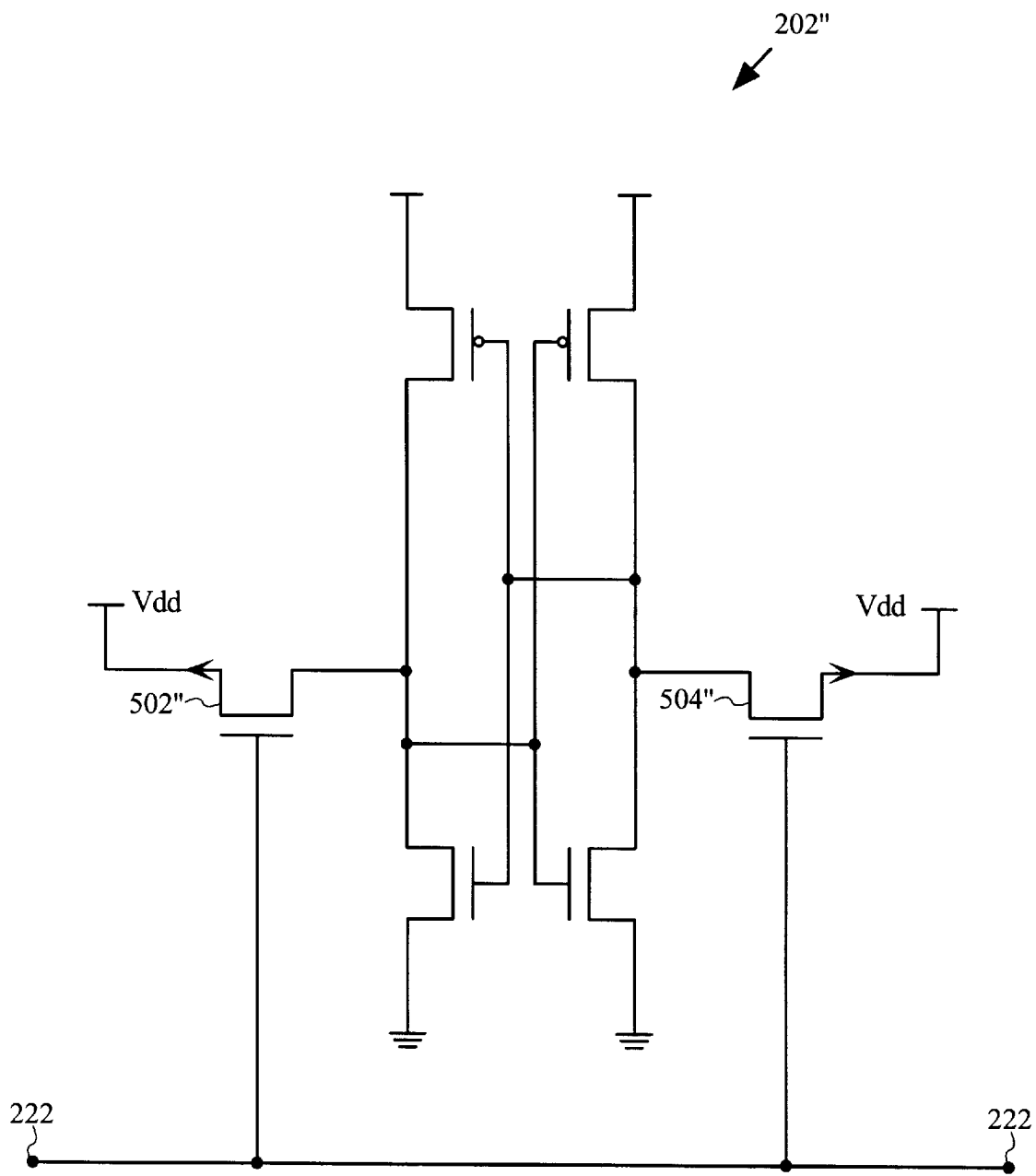
FIG. 5C shows an example of a core cell that is laid out along the model wordline in accordance with one embodiment of the present invention.

FIG. 5C shows an example of a core cell 202" which is laid out along the model wordline 222 in accordance with one embodiment of the present invention. As shown, a drain terminal of a pass gate transistor 502" is coupled to Vdd, and a drain terminal of a pass gate transistor 504" is coupled to Vdd. In this embodiment, the gate of each of the pass gate transistors 502" and 504" are coupled to the model wordline 222. Each of the core cells 202" are also generally dummy core cells that are used to approximate the RC delay experienced on the wordline 226 of the memory core 200.

Figure 6:
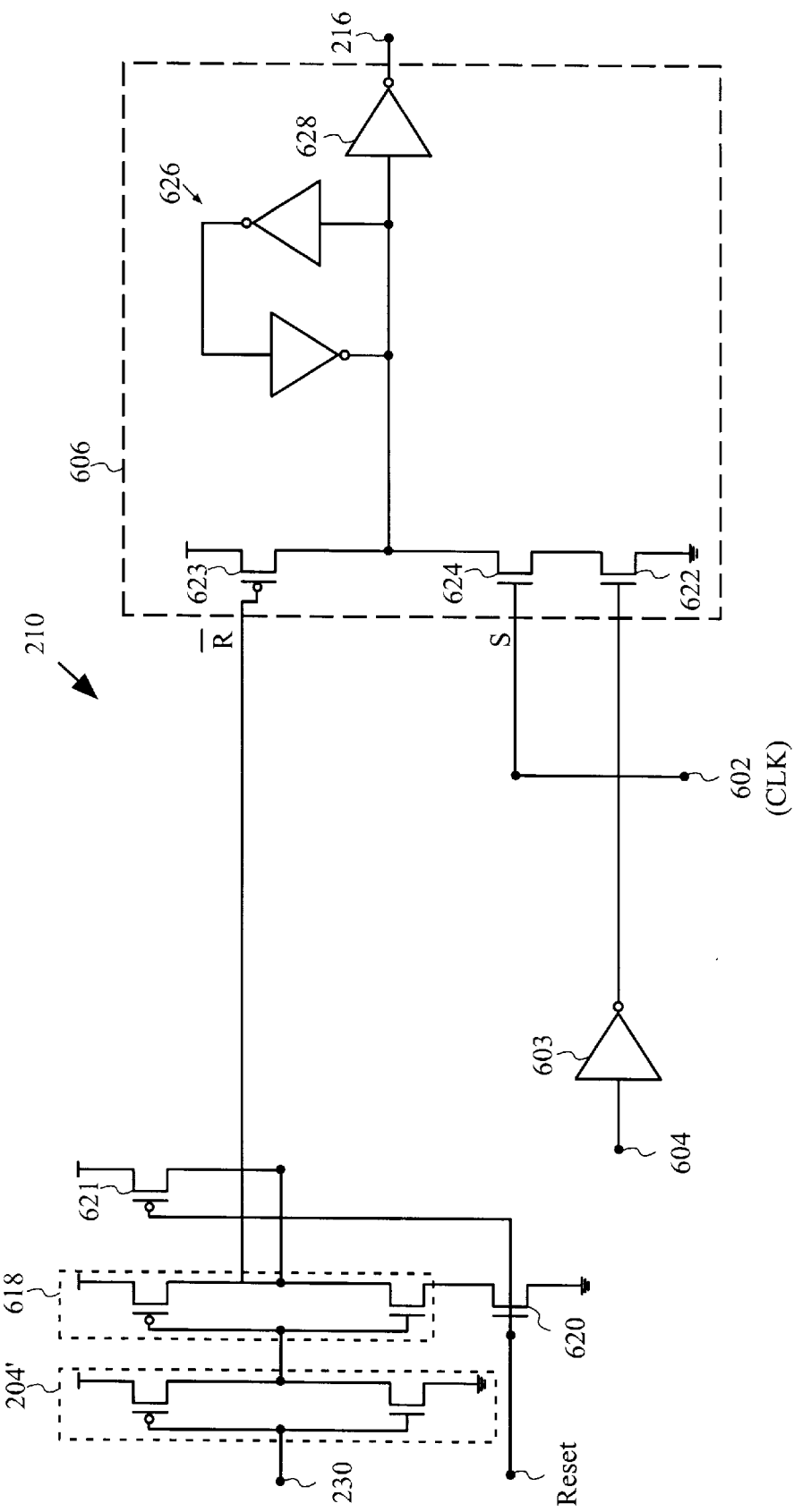
FIG. 6 is an example circuit diagram of a control circuit of FIG. 2A in accordance with one embodiment of the present invention.

FIG. 6 is an example circuit diagram of the control circuitry 210 of FIG. 2A in accordance with one embodiment of the present invention. The control circuitry 210 generally includes a model sense amplifier 204', and SET and RESET latch circuitry 606. The SET and RESET latch circuitry 606 generally includes a transistor 623 that is used for receiving a reset (/R) signal, a transistor 624 which is used for receiving a SET (S) signal from a clock (CLK) 602. The SET and RESET latch circuitry 606 also includes a transistor 622 that has its gate coupled to the output of a buffer 603, and the buffer 603 has an input 604 (i.e., which is a delay of CLK 602).

Further included in the SET and RESET latch circuitry 606 is a latch 624 and an inverter 628 that produces the signal 216. Also shown is a reset signal which is communicated to a gate of a transistor 620 and a gate of a transistor 621. In this example, bitline 230 is coupled to the model sense amplifier 204', which is shown to be an inverter circuit. The output of the model sense amplifier 204' is then coupled to an inverter 618. Generally, the reset signal is communicated after a falling edge of the signal 216 is received. As mentioned above, when signal 216 goes LOW (i.e., a falling edge), the sense amplifier is provided with a ready-to-read signal. On the other hand, when signal 216 goes HI, a wordline driver is signaled to access a particular cell.

Figure 7:
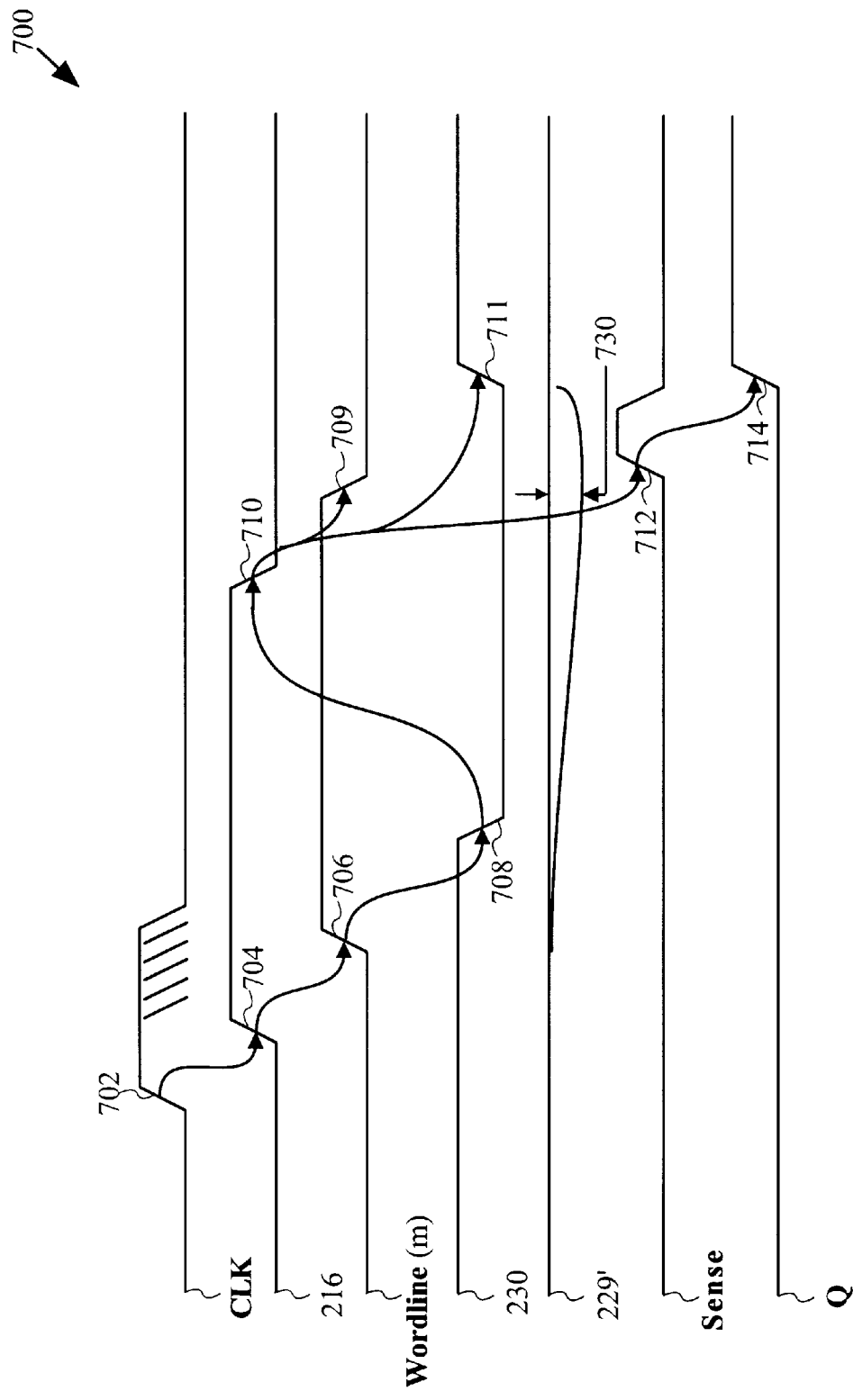
FIG. 7 shows a model path and read timing diagram 700 in accordance with one embodiment of the present invention.

FIG. 7 shows a model path and read timing diagram 700 in accordance with one embodiment of the present invention. Initially, when a memory clock (CLK) signal experiences a rising edge 702, the signal 216 is caused to produce a rising edge 704. The rising edge 704 of signal 216 therefore causes all addressed wordlines (including the model wordline), to experience a rising edge 706. The rising edge 706 then causes the model bitline 230 to produce a falling edge 708. The falling edge 708 then causes a falling edge 710 in the signal 216. The falling edge 710 also acts to shut down the wordlines and model wordlines, open up the input latches, and pre-charges the bitline and data buses.

Further, as mentioned above, when signal 216 experiences the falling edge 710, the sense amplifier 204 will be directed to begin a read, and therefore, cause the rising edge 712 on the sense line. More specifically, the falling edge 710 also produces a falling edge 709 for all of the address wordlines (including the model wordline), and a rising edge 711 in the bitline 230. In addition, the rising edge 712 of the sense signal will cause an edge 714 in an output "Q" reflecting the value of the sensed data, in this case a logical "1". It is important to note that the rising edge 712 will occur almost simultaneously when just enough bitline differential 730 has been achieved for the worst case core cell 203.

In fact, because the RC delay of the self-timing return path 114 of the prior art has been eliminated, the time in which the worst case core cell 203 reaches enough bitline differential is substantially the same as when the model core cell 203' has reached enough bitline differential. Advantageously, a memory circuit will be able to perform access operations at very high speeds because unnecessary delays have been eliminated.

Although the foregoing invention has been described in some detail for purposes of clarity of understanding, it will be apparent that certain changes and modifications may be practiced within the scope of the appended claims. It should therefore be understood that the various circuit diagrams may be embodied in any form which may include, for example, any suitable semiconductor substrate, printed circuit board, packaged integrated circuit, or software implementation.

By way of example, hardware description language (HDL) design and synthesis programs, such as, VHDL® hardware description language available from IEEE of New York, N.Y. may be implemented to design the silicon-level layouts. Accordingly, the present embodiments are to be considered as illustrative and not restrictive, and the invention is not to be limited to the details given herein, but may be modified within the scope and equivalents of the appended claims.

What is claimed is:

1. A memory circuit, comprising:
   a memory core having an array of core cells, the array of core cells being coupled to a plurality of wordlines and a plurality of bitline pairs; and
   a self-timing path having a model core cell that is coupled to a model wordline that is driven by a model wordline driver, the self-timing path further including a model sense amplifier that couples to the model core cell through a pair of model bitlines, the model wordline and the pair of model bitlines are each coupled to a plurality of dummy core cells to approximate an RC delay of a core cell of the array of core cells having a greatest RC delay; and the model wordline is a folded wordline such that the model wordline has a beginning and a termination at a location that is proximate to the model wordline driver.

2. A memory circuit as recited in claim 1, wherein the model core cell is coupled to the termination of the model wordline at the location that is proximate to the model wordline driver.

3. A memory circuit as recited in claim 2, further comprising:
   a control circuit that is configured to activate the self-timing path, the control circuit is coupled to the model sense amplifier that couples to the model core cell through said pair of model bitlines.

4. A memory circuit as recited in claim 3, wherein the control circuit is configured to supply a wordline enable signal to the model wordline driver to activate the self-timing path, such that the model wordline driver performs an access to the model core cell through the folded wordline.

5. A memory circuit as recited in claim 4, wherein the control circuit produces a ready to read signal that is supplied to a sense amplifier of the memory core.

6. A memory circuit as recited in claim 5, wherein the control circuit produces the ready to read signal upon receiving a self-timing path RC delay of the model wordline and the pair of model bitlines.

7. A memory circuit as recited in claim 6, wherein the self-timing path RC delay is substantially equal to the RC delay of the core cell having said greatest RC delay.

8. A memory circuit as recited in claim 7, wherein the core cell having said greatest RC delay is the furthest one of the array of core cells from a wordline driver and the sense amplifier of the memory core.

9. A memory circuit as recited in claim 1, further including:
   a plurality of wordline drivers being coupled to the plurality of wordlines; and
   a plurality of sense amplifiers being coupled to the plurality of bitline pairs.

10. A memory circuit as recited in claim 2, wherein a control circuit is coupled to each of a plurality of wordline drivers and each of a plurality of sense amplifiers that are coupled to the array of core cells.

11. A memory circuit as recited in claim 1, wherein the memory circuit is selected from the group consisting of a ROM circuit, a RAM circuit, an SRAM circuit, a DRAM circuit, an EPROM circuit, an EEPROM circuit.

12. A method for making a memory circuit with a self-timing path, comprising the acts of:
   providing a memory core having an array of core cells;
   integrating the self-timing path of core cells along a model wordline and along a model pair of bitlines, the model wordline is folded such that a model core cell is placed substantially at a beginning point of the model wordline, and an ending point of the model wordline is coupled to the model core cell, whereby the beginning point and the ending point of the model wordline are proximate to each other.

13. A method for making a memory circuit with a self-timing path as recited in claim 12, further comprising the act of:
   supplying a ready to read signal to a sense amplifier of the memory core after an RC delay signal indicating that an RC delay along the model wordline and an RC delay along the model pair of bitlines is complete.

14. A method for making a memory circuit with a self-timing path as recited in claim 13, wherein a falling edge of the ready to read signal triggers the sense amplifier of the memory core.

15. A method for making a memory circuit with a self-timing path as recited in claim 14, wherein a rising edge of the ready to read signal triggers a model wordline driver that is coupled to the model wordline at the beginning point of the model wordline.

16. A method for making a memory circuit with a self-timing path as recited in claim 15, wherein the memory circuit is selected from the group consisting of a ROM circuit, a RAM circuit, an SRAM circuit, a DRAM circuit, an EPROM circuit, an EEPROM circuit.

17. A memory generator for producing a memory circuit, the memory circuit includes a memory core with an array of core cells, the memory generator having program instructions for producing the memory circuit, the program instructions of the memory generator comprising:

generating a self-timing path of core cells along a model wordline and along a model pair of bitlines, the model wordline is folded such that a model core cell is placed substantially at a beginning point of the model wordline, and an ending point of the model wordline is coupled to the model core cell, whereby the beginning point and the ending point of the model wordline are proximate to each other.

18. A memory generator for producing a memory circuit as recited in claim 17, wherein the model pair of bitlines are arranged along a side of the memory core that is adjacent to a plurality of wordline drivers.

19. A memory generator for producing a memory circuit as recited in claim 18, wherein a model wordline driver is aligned at a location next to the plurality of wordline drivers, and the model wordline driver is placed next to the model core cell.

20. A memory generator for producing a memory circuit as recited in claim 19, wherein a control circuit is configured to receive a combined RC delay of the model wordline and the model pair of bitlines without a return path RC delay.

21. A method for generating a memory circuit, the memory circuit includes a memory core with an array of core cells, comprising:

generating a self-timing path of core cells along a model wordline and along a model pair of bitlines, the model pair of bitlines are arranged along a side of the memory core that is adjacent to a plurality of wordline drivers, and the model wordline is folded such that a model core cell is placed substantially at a beginning point of the model wordline, and an ending point of the model wordline is coupled to the model core cell, whereby the beginning point and the ending point of the model wordline are proximate to each other;

aligning a model wordline driver at a location next to the plurality of wordline drivers, and the model wordline driver is arranged next to the model core cell; and providing a control circuit configured to receive a combined RC delay of the model wordline and the model pair of bitlines without a return path RC delay.

22. A method for designing a memory circuit, comprising:

providing a memory core having an array of core cells;

integrating a self-timing path of core cells along a model wordline and along a model pair of bitlines, the model wordline is folded such that a model core cell is placed substantially at a beginning point of the model wordline, and an ending point of the model wordline is coupled to the model core cell, whereby the beginning point and the ending point of the model wordline are proximate to each other; and supplying a ready to read signal to a sense amplifier of the memory core after an RC delay signal indicating that an RC delay along the model wordline and an RC delay along the model pair of bitlines is complete.

23. A method for designing a memory circuit as recited in claim 22, wherein a falling edge of the ready to read signal triggers the sense amplifier of the memory core.

24. A method for designing a memory circuit as recited in claim 23, wherein a rising edge of the ready to read signal triggers a model wordline driver that is coupled to the model wordline at the beginning point of the model wordline.

25. A method for designing a memory circuit as recited in claim 24, wherein the memory circuit is selected from the group consisting of a ROM circuit, a RAM circuit, an SRAM circuit, a DRAM circuit, an EPROM circuit, an EEPROM circuit.

\* \* \* \* \*